(12) United States Patent
Fujiwara et al.

(10) Patent No.: US 12,387,990 B2
(45) Date of Patent: Aug. 12, 2025

(54) ELECTRONIC COMPONENT ACCOMMODATION PACKAGE AND ELECTRONIC DEVICE

(71) Applicant: KYOCERA Corporation, Kyoto (JP)

(72) Inventors: Hironobu Fujiwara, Higashiomi (JP); Tomoya Kon, Yasu (JP)

(73) Assignee: KYOCERA Corporation, Kyoto (JP)

( * ) Notice: Subject to any disclaimer, the term of this patent is extended or adjusted under 35 U.S.C. 154(b) by 942 days.

(21) Appl. No.: 17/288,951

(22) PCT Filed: Oct. 30, 2019

(86) PCT No.: PCT/JP2019/042567
§ 371 (c)(1),
(2) Date: Apr. 27, 2021

(87) PCT Pub. No.: WO2020/090882
PCT Pub. Date: May 7, 2020

(65) Prior Publication Data
US 2021/0398866 A1 Dec. 23, 2021

(30) Foreign Application Priority Data
Oct. 30, 2018 (JP) .................................. 2018-203588

(51) Int. Cl.
*H01L 23/08* (2006.01)
*H01L 23/053* (2006.01)
(52) U.S. Cl.
CPC ............ *H01L 23/08* (2013.01); *H01L 23/053* (2013.01)

(58) Field of Classification Search
CPC .............................. H01L 23/08; H01L 23/053
See application file for complete search history.

(56) References Cited

U.S. PATENT DOCUMENTS

| | | | |
|---|---|---|---|
| 9,603,274 B2* | 3/2017 | Shibayama | H01L 23/053 |
| 9,640,452 B2* | 5/2017 | Tsujino | H01L 23/057 |
| 2005/0207092 A1* | 9/2005 | Kubota | H01L 23/047 |
| | | | 257/E23.185 |
| 2015/0016074 A1 | 1/2015 | Tsujino et al. | |
| 2016/0104650 A1* | 4/2016 | Tsujino | H01L 33/483 |
| | | | 174/541 |

FOREIGN PATENT DOCUMENTS

| | | |
|---|---|---|
| JP | 05-343548 A | 12/1993 |
| JP | 1117041 A | 1/1999 |

(Continued)

*Primary Examiner* — Lex H Malsawma
(74) *Attorney, Agent, or Firm* — Volpe Koenig (57) ABSTRACT

Disclosed is an electronic component accommodation package, including: a substrate that has an upper surface including a mounting area; and a frame that is on the upper surface of the substrate to surround the mounting are. The frame includes: a first frame that contains a ceramic material; a second frame that has a through hole and that contains a metal material; and a third frame that contains a metal material. The first frame includes a first end and a second end, and the second frame includes a third end and a fourth end. The first end of the first frame and the fourth end of the second frame are joined to each other via a joining material, and the second end of the first frame and the third end of the second frame are joined to each other via a joining material.

19 Claims, 6 Drawing Sheets

(56) References Cited

FOREIGN PATENT DOCUMENTS

| | | | |
|---|---|---|---|
| JP | 2003-017604 | A | 1/2003 |
| JP | 2008-235531 | A | 10/2008 |
| JP | 2010-062181 | A | 3/2010 |
| JP | 2014127589 | A * | 7/2014 |
| JP | 2015-225873 | A | 12/2015 |
| JP | 2016-086126 | A | 5/2016 |
| JP | 5969317 | B2 * | 8/2016 |
| WO | 2010/150729 | A | 12/2010 |

* cited by examiner

ELECTRONIC COMPONENT ACCOMMODATION PACKAGE AND ELECTRONIC DEVICE

TECHNICAL FIELD

The present disclosure relates to an electronic component accommodation package for accommodating an electronic component, and an electronic device.

BACKGROUND ART

In recent years, airtightness of sealing has been required for electronic component accommodation packages that accommodate electronic components such as ICs (Integrated Circuits), LSIs (Large-Scale Integrations), power devices, light emitting diodes, piezoelectric elements and quartz oscillators, and electronic devices (see JP-A-2010-62181).

In the package described in JP-A-2010-62181, thermal deformation may cause a tilt in the vertical direction or input/output terminals and the like to be subjected to a load.

SUMMARY

An electronic component accommodation package according to an embodiment of the present disclosure includes: a substrate that has an upper surface including an mounting area on which an electronic component is to be mounted; a frame that is on the upper surface of the substrate to surround the mounting area and that has a through hole that penetrates the frame outward from the mounting area in a plan view. The frame includes: a first frame that is on the upper surface of the substrate to surround at least a part of the mounting area and that contains a ceramic material; a second frame that is on the upper surface of the substrate to surround at least a part of the mounting area, that has the through hole, and that contains a metal material; and a third frame that is on an upper surface of the first frame and an upper surface of the second frame to surround the mounting area in a plan view and that contains a metal material. The first frame incudes a first end and a second end, and the second frame includes a third end and a fourth end. The first end of the first frame and the fourth end of the second frame are joined to each other via a joining material, and the second end of the first frame and the third end of the second frame are joined to each other via a joining material.

The electronic device according to an embodiment of the present disclosure includes: the above-described electronic component accommodation package; an electronic component mounted on the mounting area; and a lid that covers the electronic component and that is bonded on an upper surface of the third frame via an adhesive.

DESCRIPTION OF EMBODIMENTS

Hereinafter, an electronic component accommodation package 1 and an electronic device 10 according to an embodiment of the present invention will be described referring to the drawings.

<Electronic Component Accommodation Package and Electronic Device>

First, the electronic component accommodation package 1 (hereinafter referred to as the package 1) will be described referring to FIG. 1 to FIG. 4 and FIG. 6.

The package 1 is used for accommodating an element composed of a passive element. Such elements include, for example, active elements such as semiconductor elements, transistors, diodes and thyristors, resistors, capacitors, solar cells, piezoelectric elements, crystal oscillators, ceramic oscillators, and the like. More specifically, the package 1 is suitable for an element compatible with high voltage, large current, high speed and high frequency to be mounted therein to exhibit the function. As an example of the element, an electronic component such as a semiconductor element is mounted. The electronic device 10 is the package 1 with an electronic component such as a semiconductor element mounted therein as an example of the element.

The package 1 includes a substrate 2 and a frame 11. The frame 11 includes a first frame 3, a second frame 4, and a third frame 7. The first frame 3 is on the upper surface 24 of the substrate 2. The second frame 4 is joined to the first frame 3. The third frame 7 is on the upper surface of the first frame 3 and the upper surface of the second frame 4. The second frame 4 has a through hole O in a side wall. The through hole O penetrates the side wall outward from an mounting area 21 in a plan view.

Figure 4:
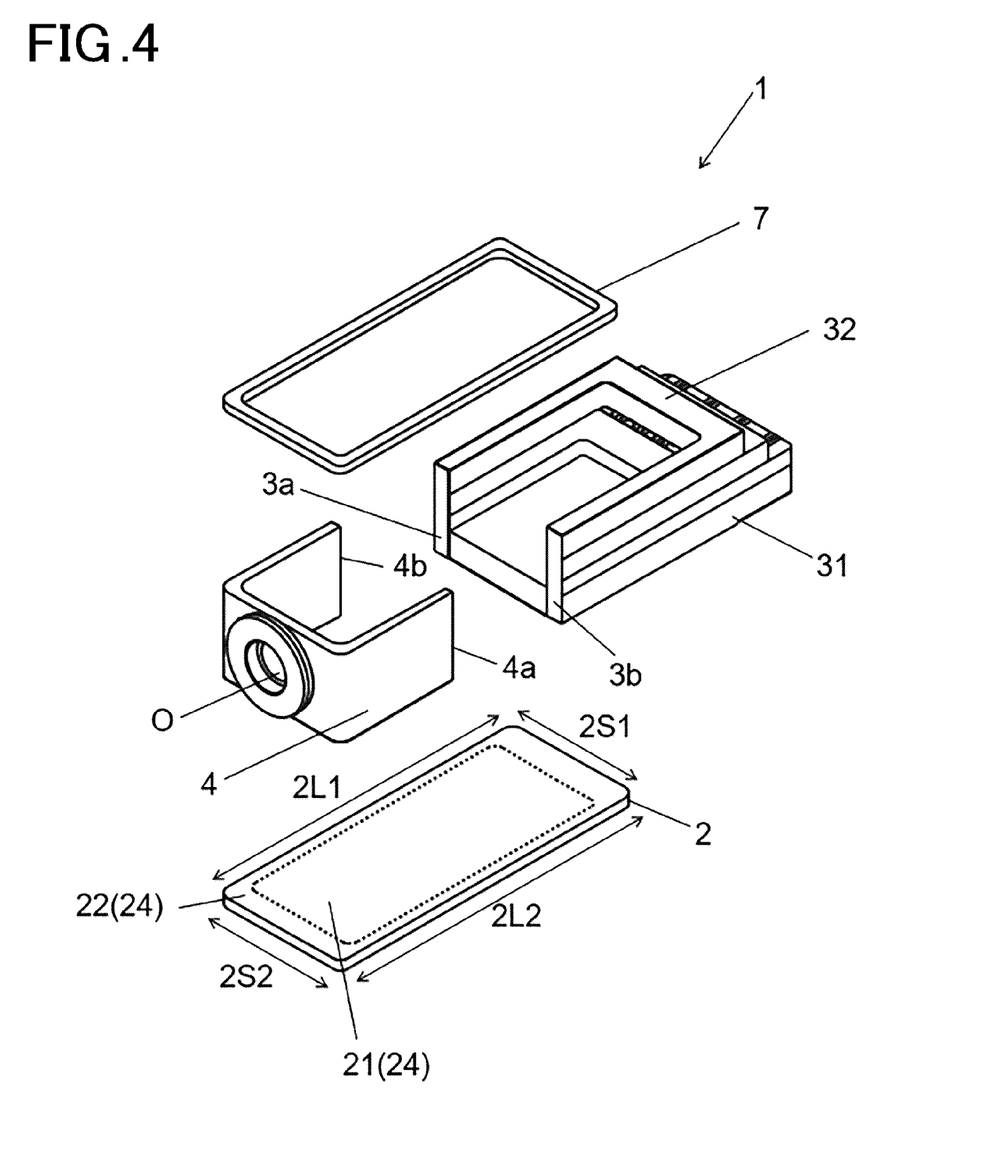
FIG. 4 is an exploded perspective side view of the electronic component accommodation package according to the embodiment of the present disclosure.

The substrate 2 has, for example, a rectangular shape in a plan view. As illustrated in FIG. 4, the upper surface 24 of the substrate 2 includes a mounting area 21 on which the electronic component 5 is to be mounted and a peripheral area 22 surrounding the mounting area 21. The substrate 2 may be made of, for example, a metal material such as copper, iron, tungsten, molybdenum, nickel or cobalt, or an alloy containing any of these metal materials. The substrate 2 may have a function of efficiently dissipating the heat generated in the package 1 by the electronic component 5 to the outside of the package 1. The substrate 2 may have good thermal conductivity. The thermal conductivity of the substrate 2 can be, for example, 15 W/(m·K) or more and 450 W/(m·K) or less. The coefficient of thermal expansion of the substrate 2 may be, for example, $3 \times 10^{-6}$/K or more and $28 \times 10^{-6}$/K or less.

The substrate 2 is manufactured into a predetermined shape by applying metal working such as rolling or punching to an ingot that is obtained by casting a molten metal material into a mold and solidifying it. The length of each side of the substrate 2 in a plan view is, for example, 5 mm or more and 50 mm or less. More specifically, as illustrated in FIG. 4, the substrate 2 may have a rectangular shape with a first long side 2L1, a second long side 2L2, a first short side 2S1, and a second short side 2S2 in a plan view. In this case, the first long side 2L1 and the second long side 2L2 may be, for example, 10 mm or more and 50 mm or less, and the first short side 2S1 and the second short side 2S2 may be, for example, 5 mm or more and 20 mm or less. The thickness of the substrate 2 in the vertical direction (direction orthogonal to the upper surface 24 of the substrate 2) is, for example, 0.3 mm or more and 5 mm or less.

In order to prevent oxidative corrosion, a metal layer of nickel, gold or the like may be formed on the surface of the substrate 2 by electroplating or electroless plating. The thickness of the metal layer is, for example, 0.5 μm or more and 9 μm or less.

The frame 11 is on the upper surface 24 of the substrate 2 to surround the mounting area 21. As described above, the frame 11 includes the first frame 3, the second frame 4, and the third frame 7. The first frame 3 is on the upper surface of the substrate 2 along the peripheral area 22 of the substrate 2. The first frame 3 may serve as an input/output terminal and can exchange signals between the internal electronic component 5 and the outside. The first frame 3 has, for example, a U shape in a plan view and may surround the inside from three directions. That is, the first frame 3 may be any member that is on the upper surface 24 of the substrate 2 to surround at least a part of the mounting area 21.

Figure 2:
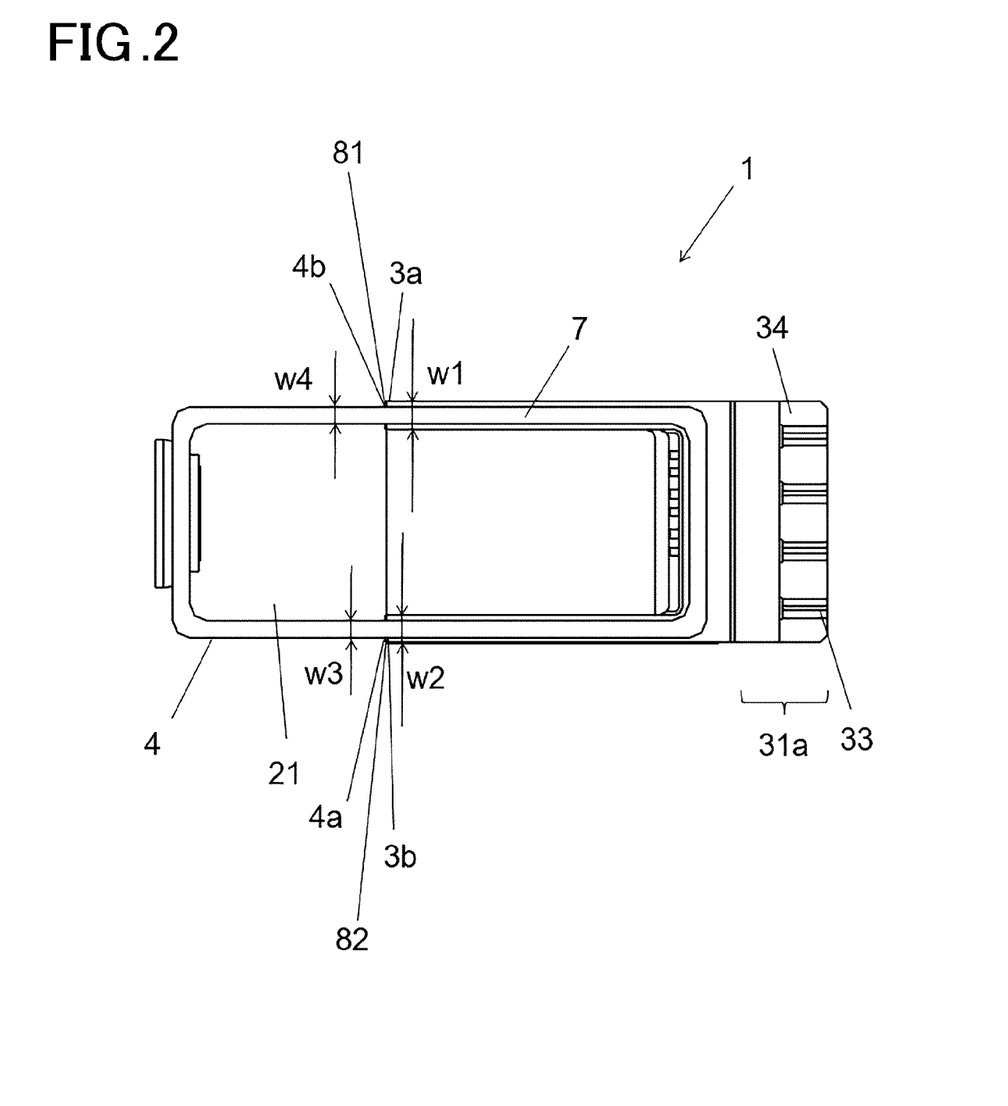
FIG. 2 is a top view of the electronic component accommodation package according to the embodiment of the present disclosure.
Figure 3:
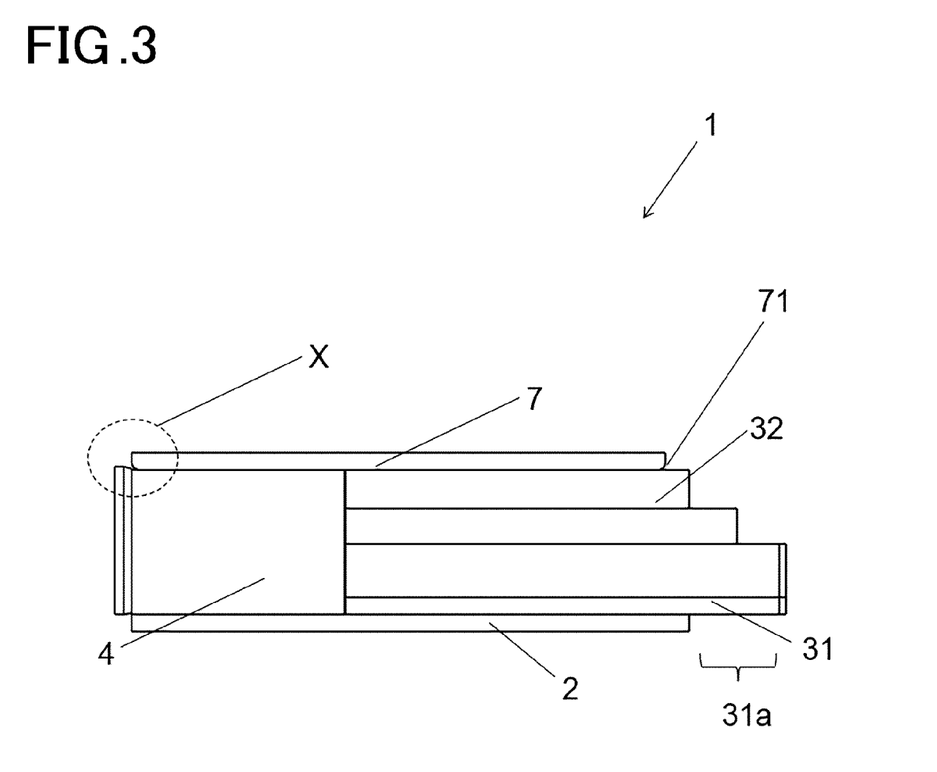
FIG. 3 is a side view of the electronic component accommodation package according to the embodiment of the present disclosure.

As illustrated in FIGS. 3 and 4, the first frame 3 may include a frame-shaped flat plate portion 31 and a frame-shaped wall portion 32 disposed on the flat plate portion 31. As illustrated in FIGS. 2 and 3, the flat plate portion 31 may have a protruding portion 31a protruding outward from the outer edge of the substrate 2 in a plan view. In this regard, a signal wiring 33 may be disposed on the upper surface of the protruding portion 31a. This allows the package 1 to be readily connected to an external electric circuit board via the protruding portion 31a. The external electric circuit board may be, for example, a flexible board.

In the present embodiment, as illustrated in FIG. 4, the frame-shaped flat plate portion 31 of the first frame 3 includes a plate-shaped part in contact with the substrate 2 and a U-shaped frame part on the plate-shaped part. Even in this shape, the first frame 3 is disposed to surround at least a part of the mounting area 21 of the substrate 2.

The first frame 3 may include a metallized layer (not shown) that is on the under surface of the flat plate portion 31 and joined to the substrate 2, the signal wiring 33 on the upper surface of the flat plate portion 31, a metal layer (not shown) on the upper surface of the wall portion 32, and a ground layer 34 on the upper surfaces of the flat plate portion 31 and the wall portion 32. The signal wiring 33 is provided for electric conduction between the inside and outside of the package 1. Further, the signal wiring 33 is a base for connecting a lead terminal or the like provided on the outside of the package 1. The metal layer is a base for joining the second frame 4, which will be described later, by a metal joining material such as a brazing material or solder. The flat plate portion 31 has a rectangular shape in a plan view. The wall portion 32 has a shape that is obtained by removing one side from a frame in a plan view. The flat plate portion 31 and the wall portion 32 may be integrally formed in one piece. Alternatively, an insulating layer for further wiring a signal line may be provided between the flat plate portion 31 and the wall portion 32. The first frame 3 can be freely and suitably configured according to the design of the signal wiring and the like of the package 1. The first frame 3 contains a ceramic material. That is, the flat plate portion 31 and the wall portion are made of an insulating material, for example a ceramic material such as an alumina-based sintered body, a mullite-based sintered body, a silicon carbide-based sintered body, an aluminum nitride-based sintered body, and a silicon nitride-based sintered body, or glass ceramics. The signal wiring 33 and the metal layer may be constituted by a base of a high-melting-point metal material such as tungsten, molybdenum or manganese and a plating layer of nickel, gold or the like formed thereon. The coefficient of thermal expansion of the flat plate portion 31 or the wall portion 32 containing a ceramic material is, for example, $3\times10^{-6}$/K or more and $8\times10^{-6}$/K or less.

A method of manufacturing the first frame 3 will be described. On the upper surface, the under surface and the end surface opposed to the through hole O of the unsintered flat plate portion 31 before being fired, a plurality of signal wirings 33 and the ground layer 34 are formed along a side of the upper surface of the flat plate portion 31, for example, by screen printing. Further, on the upper surface of the wall portion 32 before being fired, the metal layer and the ground layer 34 are formed by screen printing. Then, the wall portion 32, on which the unsintered metal layer and ground layer 34 before being fired are formed, is pressure-bonded onto on the flat plate portion 31, on which the unsintered signal wirings 33 and ground layer 34 before being fired are formed, and the wall portion 32 and the flat plate portion 31 are fired simultaneously. The first frame 3 can be manufactured in this way.

In the fired first frame 3 after firing, the flat plate portion 31 and the wall portion 32 are integrated in one piece. In a plan view of the first frame 3, each signal wiring 33 appears to be divided into two parts by the wall portion 32, but the signal wiring 33 is continuous directly under the wall portion 32. Accordingly, in a plan view of the first frame 3, the part of each signal wiring 33 located inside the package 1 is electrically continuous with the part of the signal wiring 33 located outside the package 1. This allows the electronic component 5 in the package 1 to be connected to an electric circuit board outside the package 1 via the signal wirings 33.

In a plan view, the length of each side of the flat plate portion 31 is, for example, 3 mm or more and 50 mm or less. The height of the flat plate portion 31 is, for example, 1 mm or more and 10 mm or less. Further, in a plan view, the length of each side of the wall portion 32 is, for example, 1 mm or more and 50 mm or less. The height of the wall portion 32 is, for example, 1 mm or more and 10 mm or less.

Lead terminals (not shown) may be electrically connected on the signal wirings 33 via a brazing material. The lead terminals are provided for electric connection to an external electric circuit board or the like. By disposing the adjacent signal wirings 33 with a gap between them, the adjacent signal wirings 33 are electrically insulated from each other, and the electromagnetic coupling is also reduced.

The second frame 4 is joined to the upper surface 24 of the substrate 2 along the peripheral area 22 of the substrate 2 and is provided for protecting the electronic component 5 from the outside as with the first frame 3. The second frame 4 may have a frame shape, for example, formed in a U-shape in a plan view. The second frame 4 may have a shape that surrounds the inside from three directions. That is, the second frame 4 may be any member that is on the upper surface 24 of the substrate 2 to surround at least a part of the mounting area 21. Further, the second frame 4 may have the through hole O. For example, the second frame 4 is brazed to the upper surface 24 of the substrate 2 via a brazing material. This shape facilitates the processing of the second frame 4, for example, compared to a second frame 4 that has a shape of surrounding all four sides and has an opening on a wall. As a result, the productivity can be improved. Further, also with regard to joining to the first frame 3, this shape can reduce the joining area, which can reduce mutual influence due to thermal deformation.

Further, the second frame 4 contains a metal material. More specifically, the second frame 4 is made of, for example, a metal material such as copper, iron, tungsten, molybdenum, nickel or cobalt, or an alloy containing any of these metal materials. The second frame 4 may have a function of efficiently dissipating the heat generated in the package by the electronic component 5 1 to the outside of the package 1. The thermal conductivity of the second frame 4 is, for example, 15 W/(m·K) or more and 450 W/(m·K) or less. The coefficient of thermal expansion of the second frame 4 is, for example, $3\times10^{-6}$/K or more and $28\times10^{-6}$/K or less.

Further, as illustrated in FIG. 2, the second frame 4 may have a size that fits in the substrate 2 in a plan view. The length of the side of the second frame 4 along the short sides of the substrate 2 is, for example, 5 mm or more and 20 mm or less. The height of the second frame 4 is, for example, 5 mm or more and 20 mm or less. In a plan view of the second frame 4, the thickness of the second frame 4 is, for example, 0.5 mm or more and 3 mm or less. As used herein, the height of the second frame 4 refers to the size of the second frame 4 in the direction perpendicular to the substrate 2 in FIG. 3. As will be described later, the thickness of the second frame 4 refers to the size of the second frame 4 in the direction perpendicular to the long sides or the short sides of the substrate 2 in a plan view as illustrated in FIG. 2. The height and thickness of other frames can be defined in the same way.

Further, a lens or the like that transmits an optical signal may be provided to the second frame 4 at a position where the through hole O is formed. For example, this allows an optical signal transmitted from the optical component mounted in the package 1 to be output to the outside.

Figure 1:
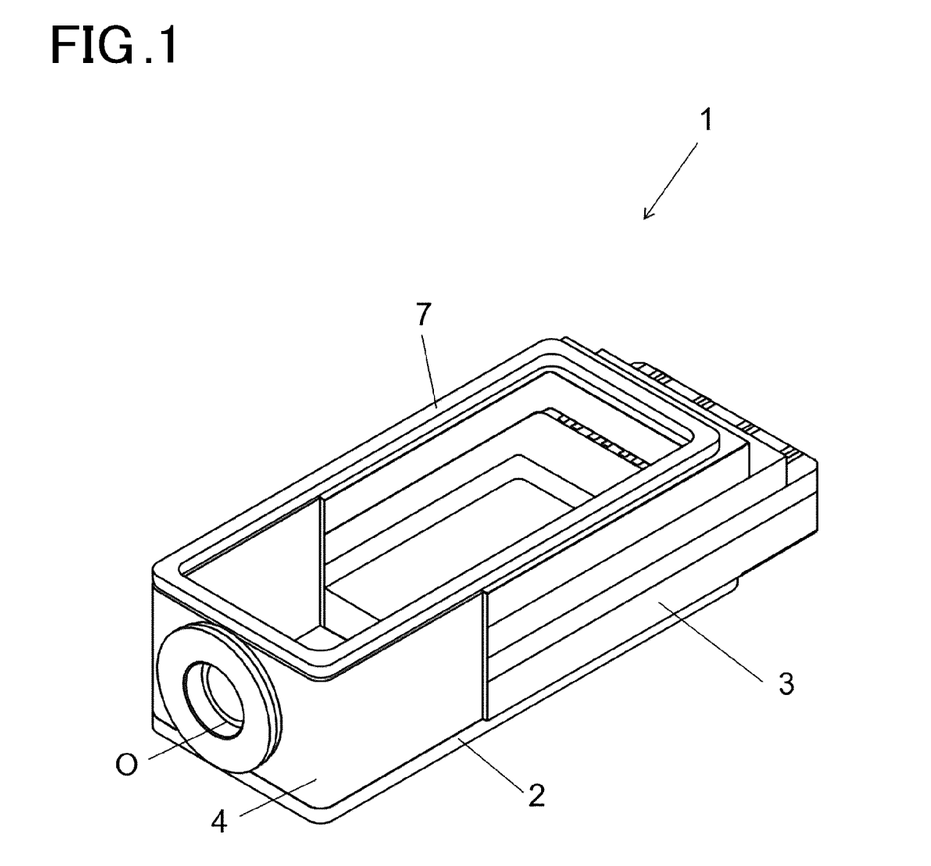
FIG. 1 is an overall perspective view of an electronic component accommodation package according to an embodiment of the present disclosure.

As illustrated in FIGS. 1 and 2, the third frame 7 has a ring shape. The third frame 7 is on the upper surface of the first frame 3 and the upper surface of the second frame 4. Since the first frame 3 and the second frame 4 are located along the upper surface 24 of the substrate 2, the outer edge of the third frame 7 may have the same shape as that of the substrate 2. Further, the third frame 7 contains a metal material. For example, the third frame 7 may be made of the same material as the second frame 4. In this case, the second frame and the third frame has the same coefficient of thermal expansion, which can reduce the risk of breakage due to thermal expansion at the joint surface between the second frame 4 and the third frame 7. The third frame 7 is made of, for example, a metal material such as copper, iron, tungsten, molybdenum, nickel or cobalt, or an alloy containing any of these metal materials.

As illustrated in FIGS. 2 and 4, the first frame 3 includes a first end 3a and a second end 3b, and the second frame 4 includes a third end 4a and a fourth end 4b. The first frame 3 and the second frame 4 are joined with each other via a joining material at the respective ends opposed to each other. More specifically, the first end 3a of the first frame 3 and the fourth end 4b of the second frame 4 are joined to each other via the joining material, and the second end 3b of the first frame 3 and the third end 4a of the second frame 4 are joined to each other via the joining material. That is, the package 1 has such a shape that surrounds the mounting area 21 from all four sides by the first frame 3 and the second frame 4. The joining material is a brazing material or the like. Then, the third frame 7, which is another member, is disposed on the upper surface of the first frame 3 and the upper surface of the second frame 4 so as to surround the mounting area 21.

In the present embodiment having the above-described configuration, the first frame 3 and the second frame 4 are joined only at the respective ends in contrast to a configuration in which, for example, a second frame 4 has cutouts to which the ends and the upper surfaces of a first frame 3 are joined. This can reduce the joining area between the first frame 3 and the second frame 4. With the reduced joining area, it is possible to reduce the stress due to the difference in coefficient of thermal expansion and to reduce a load such as thermal stress that has an influence on both sides. Further, the first frame 3 and the second frame 4 may have a stepped shape.

In the present embodiment, the presence of the third frame 7, which is a different member from the first frame 3 and the second frame 4, ensures the joining strength to the lid 6. Accordingly, even when the first frame 3 and the second frame 4 have different heights, it is possible to reduce the risk of the airtightness of the electronic device 10 being impaired.

At the opposite ends where the first frame 3 and the second frame 4 are joined to each other, the first frame 3 may be thicker than the second frame 4. That is, in a plan view as illustrated in FIG. 2, the thickness w1 at the first end 3a of the first frame 3 may be greater than the thickness w4 at the fourth end 4b of the second frame 4, and the thickness w2 at the second end 3b of the first frame 3 may be greater than the thickness w3 at the third end 4a of the second frame 4. As used herein, a thickness w refers to the width of a frame member in a plan view. More specifically, at opposite ends, a thickness w refers to the size of a frame member in a direction perpendicular to the long sides of the substrate 2 in a plan view. With this configuration, the package 1 can maintain the joining strength and the airtightness even when a misalignment between the joining surfaces of the first frame 3 and the second frame 4 occurs due to a positional error at the time of joining. As a result, the productivity of the package 1 with high airtightness is improved.

In the present embodiment, as illustrated in FIG. 2, the thickness of the first frame 3 and the thickness of the second frame are both constant over the entire length. That is, the thickness w1 of the first end 3a and the thickness w2 of the second end 3b are equal, and the thickness w3 of the third end 4a and the thickness w4 of the fourth end 4b are equal. This configuration facilitates manufacture of the frame members. However the shape of each frame member is not limited to this, and any frame member may have a shape in which a certain part has a different thickness from the other part.

When the substrate 2 has a rectangular shape, the position of the joint portion 8 between the first frame 3 and the second frame 4 may overlap the position of the long sides of the substrate 2. That is, in a plan view as illustrated in FIG. 2 and FIG. 4, the substrate 2 has a rectangular shape with the first long side 2L1, the second long side 2L2, the first short side 2S1 and the second short side 2S2. In the plan view, a first joint portion 81, at which the first end 3a of the first frame 3 and the fourth end 4b of the second frame 4 are joined to each other, may overlap the first long side 2L1 of the substrate 2. Further, a second joint portion 82, at which the second end 3b of the first frame 3 and the third end 4a of the second frame 4 are joined to each other, may overlap the second long side 2L2 of the substrate 2. With this configuration, it is possible to fix the long sides of the substrate 2, which tends to be deformed due to thermal stress, by the joining material or the like. This can reduce deformation of the substrate 2 due to thermal stress or the like. In this regard, the joint portion 8 is only preferred to be located substantially along the long sides of the substrate 2 and may be apart from the long sides within the range of production error or the like.

As illustrated in FIG. 4, the first joint portion 81 and the second joint portion 82 may be opposed to each other in a plan view. In this configuration, the first joint portion 81 and the second joint portion 82 are arranged at the same position on the respective long sides of the substrate 2. This can reduce the inclination and dimensional error of the package 1 caused by joining and improve the airtightness.

In a plan view, a part of the first frame 3 is on the first short side 2S1 of the substrate 2, and a part of the second frame 4 is on the second short side 2S2 of the substrate 2. In this regard, the first joint portion 81 and the second joint portion 82 may be located closer to the first short side 2S1 than to the second short side 2S2 (not shown). This configuration increases the ratio of metal material in the package 1. This can increase the thermal conductivity of the entire package 1 and improve the heat dissipation property. In addition, the cost for the package 1 can be reduced.

As illustrated in FIGS. 1 and 2, the outer edge of the first frame 3 may be located outside the outer edge of the third frame 7 in a plan view. This configuration can reduce the risk of a crack being formed by a stress on an end (corner) of the joining surface at which the first frame 3 and the third frame 7 are joined to each other.

Figure 6:
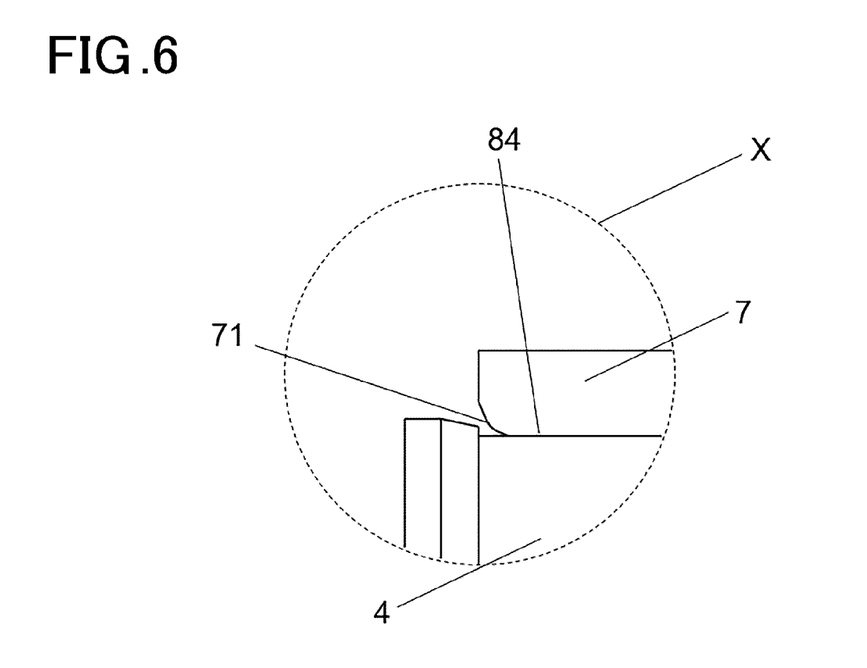
FIG. 6 is an enlargement of X in FIG. 3.

As illustrated in FIG. 6, the third frame 7 may have a curved surface 71 at the outer periphery at the portion joined to the first frame 3 and/or the second frame 4. That is, the third frame 7 includes a third joint portion 83 (not shown) joined to the first frame 3 and a fourth joint portion 84 joined to the second frame 4, and at least one of the third joint portion 83 and the fourth joint portion 84 may have a curved surface 71 at the outer periphery. In this regard, the curved surface 71 extends at least from the under surface of the third frame 3 to the lateral surface of the outer periphery. This can disperse the thermal stress that is concentrically generated at the corners of the third frame land reduce the risk of breakage of the third frame 7. The curved surface 71 may be provided either over the entire outer periphery of the first frame 3 and/or the second frame 4 or only at a part of the outer periphery.

In this regard, the curved surface 71 may be located inside the outer edge of the first frame 3 in a plan view (see FIG. 3). This configuration has both the effect of relaxing the thermal stress at the corners of the third frame 7 and the effect of improving the joining strength by promoting the brazing material to form a fillet at the time of joining to the first frame 3. As a result, the airtightness can be further improved.

Figure 5:
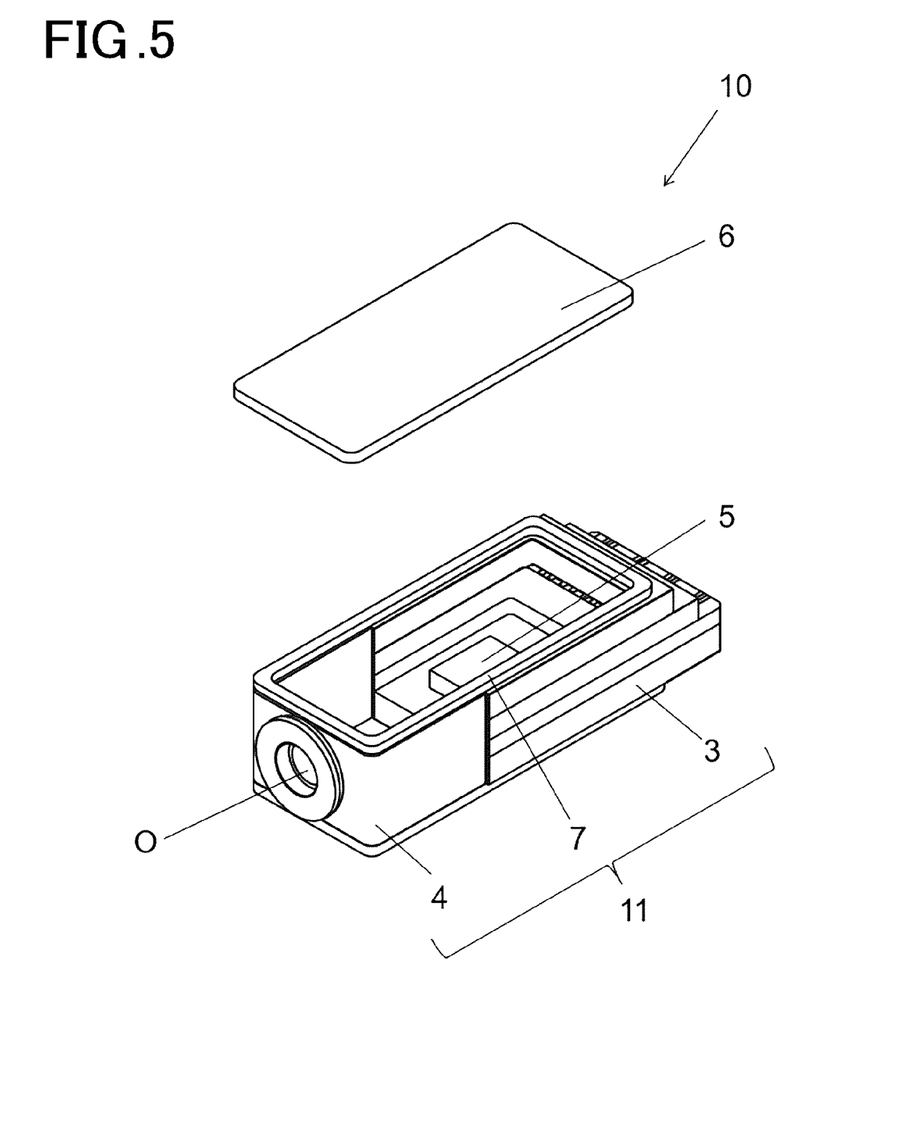
FIG. 5 is an overall perspective view of an electronic device according to an embodiment of the present disclosure.

Next, the electronic device 10 will be described referring to FIGS. 1 and 5.

As illustrated in FIG. 1, the electronic device 10 can be manufactured by mounting the electronic component 5 in the package 1. The electronic component 5 is electrically connected to the signal wirings 33 extended to the area surrounded by the second frame 4. Further, for example, by fixing an optical fiber to the lens provided at the through hole O of the package 1, it is possible to input/output an optical signal from the optical fiber into the package 1.

The lid 6 has, for example, the same size as the second frame 4 in a plan view. The lid 6 is joined to the third frame 7 disposed on the upper surface of the second frame 4 and the upper surface of the first frame 3 by seam welding or via an adhesive such as solder. The lid 6 is made of a metal material such as copper, iron, tungsten, molybdenum, nickel or cobalt. The thickness of the lid 6 is, for example, from 0.5 to 3 mm. By joining the lid 6 to the upper surface of the third frame 7, the inner space surrounded by the package 1 and the lid 6 can be hermetically sealed.

<Method of Manufacturing Electronic Device>

Hereinafter, a method of manufacturing the electronic device 10 illustrated in FIG. 5 will be described. First, the substrate 2, the first frame 3, and the second frame 4 are prepared. Each of the substrate 2 and the second frame 4 is manufactured into a predetermined shape by applying metal working to an ingot that is obtained by casting a molten metal material into a mold and solidifying it.

As for the first frame 3, a ceramic green sheet to be the flat plate portion 31 and a ceramic green sheet die-cut corresponding to the wall portion 32 are prepared. Then, organic solvent containing molybdenum or manganese is applied to the ceramic green sheet to be the flat plate portion 31, for example, by screen printing so that the signal wirings 33 of metal paste are formed. Further, organic solvent containing molybdenum or manganese is applied to the ceramic green sheet to be the wall portion 32, for example, by screen printing so that the metal layer of metal paste is formed. Then, the ceramic green sheet to be the wall portion 32 is laminated on the ceramic green sheet to be the flat plate portion 31, and the laminate is sintered and cut into individual pieces having a desired shape. The first frame 3 is thus formed. Furthermore, the metal layer is formed on the end surfaces (first end 3a and second end 3b) of the first frame 3 by screen printing, which become the joint surfaces with the second frame 4. The first frame 3 can be manufactured in this way. Regarding the prepared second frame 4, a lens may be inserted in the through hole O of the second frame 4 and fixed by a brazing material.

Then, the substrate 2, the first frame 3, and the second frame 4 thus prepared are joined together via a brazing material. In this step, pieces of the brazing material are placed respectively to portions of the second frame 4 to be joined to the substrate 2 and the first frame 3 beforehand. The second frame 4, the substrate 2 and the first frame 3 are heated so that the brazing material spreads and wets the joint surfaces. Then, by cooling, the second frame 4, the substrate 2 and the first frame are joined together. The electronic component accommodation package 1 can be manufactured in this way. Further, the electronic device 10 can be manufactured by mounting the electronic component or the like on the mounting area 21 of the manufactured electronic component accommodation package 1 with a joining material such as solder and covering the electronic component accommodation package 1 by the lid 6.

The present invention is not limited to the above-described embodiment, and various modifications and improvements including those of numerical values can be made without departing from the features of the present invention. Further, the method of mounting the electronic component is not specified in the present embodiment.

REFERENCE SIGNS LIST

1 Electronic component accommodation package
2 Substrate
  21 Mounting area
  22 Peripheral area
3 First frame
  3a First end
  3b Second end
  31 Flat plate portion
    31a (Protruding portion)
  32 wall portion 33 Signal wiring
34 Ground layer
4 Second frame
    4a Third end
    4b Fourth end
5 Electronic component
6 Lid
7 Third frame
71 Curved surface
8 Joint portion
    81 First joint portion
    82 Second joint portion
10 Electronic device
11 Frame
O Through hole
w1 to w4 Thickness

The invention claimed is:

1. An electronic component accommodation package, comprising:
- a substrate that has an upper surface including a mounting area on which an electronic component is to be mounted; and
- a frame that is on the upper surface to surround the mounting area and that has a through hole penetrating the frame outward from the mounting area in a plan view;

wherein the frame includes:
- a first frame that is on the upper surface to surround at least a part of the mounting area and that contains a ceramic material; and
- a second frame that is on the upper surface to surround at least a part of the mounting area, that has the through hole and that contains a metal material,
  wherein the first frame includes a first end and a second end separated from the first end, and the second frame includes a third end and a fourth end separated from the third end, wherein the first end and the fourth end are joined to each other, and the second end and the third end are joined to each other, such that the first frame and the second frame are directly connected to each other on only a single plane that is perpendicular to the upper surface, wherein in the plan view, the first frame includes a first portion extending in a first direction and the second frame includes a second portion extending in the first direction, wherein the first portion includes the first end and the second portion includes the fourth end, and wherein in a perpendicular direction that is perpendicular to the first direction, an outer edge of the first end of the first frame is outside an outer edge of the fourth end of the second frame.

2. The electronic component accommodation package according to claim 1, further comprising
- a third frame that is on an upper surface of the first frame and an upper surface of the second frame to surround the mounting area in the plan view and that contains a metal material, and
  wherein a material of the second frame is same as a material of the third frame.

3. The electronic component accommodation package according to claim 2, wherein in the plan view, an outer edge of the first frame is located outside an outer edge of the third frame.

4. The electronic component accommodation package according to claim 2,
wherein the third frame includes a third joint portion joined to the upper surface of the first frame, and a fourth joint portion joined to the upper surface of the second frame, and
wherein at least one of the third joint portion and the fourth joint portion has a curved surface at an outer periphery.

5. The electronic component accommodation package according to claim 4,
wherein the third joint portion has the curved surface at the outer periphery, and
wherein in the plan view, the curved surface is located inside an outer edge of the first frame.

6. An electronic device, comprising:
- the electronic component accommodation package according to claim 2;
- an electronic component mounted on the mounting area; and
- a lid that covers the electronic component and that is bonded on an upper surface of the third frame via an adhesive.

7. The electronic device according to claim 6, wherein a part of the first frame is located between the electronic component and the substrate.

8. The electronic component accommodation package according to claim 1, wherein in the plan view, the second frame has a U-shape along a part of an outer edge of the substrate.

9. The electronic component accommodation package according to claim 1, wherein in the plan view, a thickness of the first end of the first frame is greater than a thickness of the fourth end of the second frame, and a thickness of the second end of the first frame is greater than a thickness of the third end of the second frame.

10. The electronic component accommodation package according to claim 1,
wherein in the plan view, the substrate has a rectangular shape with a first long side, a second long side, a first short side, and a second short side, and
wherein in the plan view, a first joint portion overlaps the first long side of the substrate, and a second joint portion overlaps the second long side of the substrate, the first joint portion being a portion at which the first end of the first frame and the fourth end of the second frame being joined to each other, the second joint portion being a portion at which the second end of the first frame and the third end of the second frame being joined to each other.

11. The electronic component accommodation package according to claim 10, wherein in the plan view, the first joint portion and the second joint portion are opposed to each other.

12. The electronic component accommodation package according to claim 10,
wherein in the plan view, a part of the first frame is on the first short side of the substrate, and a part of the second frame is on the second short side of the substrate, and
wherein in the plan view, the first joint portion and the second joint portion are closer to the first short side than to the second short side.

13. The electronic component accommodation package according to claim 1,
wherein the first frame includes a protruding portion that protrudes outward from an outer edge of the substrate in the plan view, and
wherein a signal wiring is provided on an upper surface of the protruding portion.

14. The electronic component accommodation package according to claim 13,
wherein the protruding portion comprises a first layer and a second layer on the first layer, and
wherein in a side view, a first distance between an outer edge of the first layer and the outer edge of the substrate is different from a second distance between an outer edge of the second layer and the outer edge of the substrate.

15. The electronic component accommodation package according to claim 1,
wherein in the plan view, a thickness of the first end of the first frame is greater than a thickness of the fourth end of the second frame, or
wherein in the plan view, a thickness of the second end of the first frame is greater than a thickness of the third end of the second frame.

16. The electronic component accommodation package according to claim 1, wherein in the plan view and in the perpendicular direction, an inner edge of the first end of the first frame is inside an inner edge of the fourth end of the second frame.

17. The electronic component accommodation package according to claim 1, wherein in the plan view, the first frame has a U-shape along a part of an outer edge of the substrate.

18. The electronic component accommodation package according to claim 1,
wherein the first frame comprises a flat plate portion and a wall portion located on the flat plate portion, and
wherein the flat plate portion includes a plate-shaped part in contact with the substrate and a U-shaped frame part on the plate-shaped part.

19. The electronic component accommodation package according to claim 1,
wherein the first frame comprises a flat plate portion and a wall portion located on the flat plate portion,
wherein a signal wiring is located on un upper surface of the flat plate portion, and
wherein in the plan view, the signal wiring comprises a first part located inside the wall portion and a second part located outside the wall portion and a third part under the wall portion, and the first part is electrically continuous with the second part via the third part.

* * * * *